(12) United States Patent
Hughes

(10) Patent No.: US 8,139,782 B2
(45) Date of Patent: Mar. 20, 2012

(54) MODULAR AMPLIFICATION SYSTEM

(76) Inventor: Paul Hughes, Fremont, CA (US)

( * ) Notice: Subject to any disclaimer, the term of this patent is extended or adjusted under 35 U.S.C. 154(b) by 1477 days.

(21) Appl. No.: 11/473,922

(22) Filed: Jun. 23, 2006

(65) Prior Publication Data

US 2007/0019828 A1    Jan. 25, 2007

(51) Int. Cl.
*H04B 1/00*    (2006.01)
*H03F 99/00*    (2009.01)

(52) U.S. Cl. .......................... 381/86; 381/120

(58) Field of Classification Search ................ 381/27, 381/86, 120, 300–302
See application file for complete search history.

(56) References Cited

U.S. PATENT DOCUMENTS

| | | | | |
|---|---|---|---|---|
| 4,905,284 | A * | 2/1990 | Kwang | 381/27 |
| 5,751,823 | A * | 5/1998 | Strickland et al. | 381/94.6 |
| 6,983,052 | B2 * | 1/2006 | Kemmerer et al. | 381/86 |
| 2003/0103634 | A1 * | 6/2003 | Ito | 381/86 |

* cited by examiner

*Primary Examiner* — Curtis Kuntz
*Assistant Examiner* — Sunita Joshi
(74) *Attorney, Agent, or Firm* — Stevens Law Group; David R. Stevens

(57) ABSTRACT

A system is provided for amplifying audio signals from an audio source for use on a motorcycle or other personal motorized vehicles that includes a control module configured to receive audio input signals from a source and a plurality of outputs to send amplified audio output signals to a plurality of satellite amplifiers, a plurality of satellite amplifiers configured to receive an audio signal from a source and a plurality of control cables configured to connect the components.

10 Claims, 4 Drawing Sheets

MODULAR AMPLIFICATION SYSTEM

BACKGROUND

Figure 1:
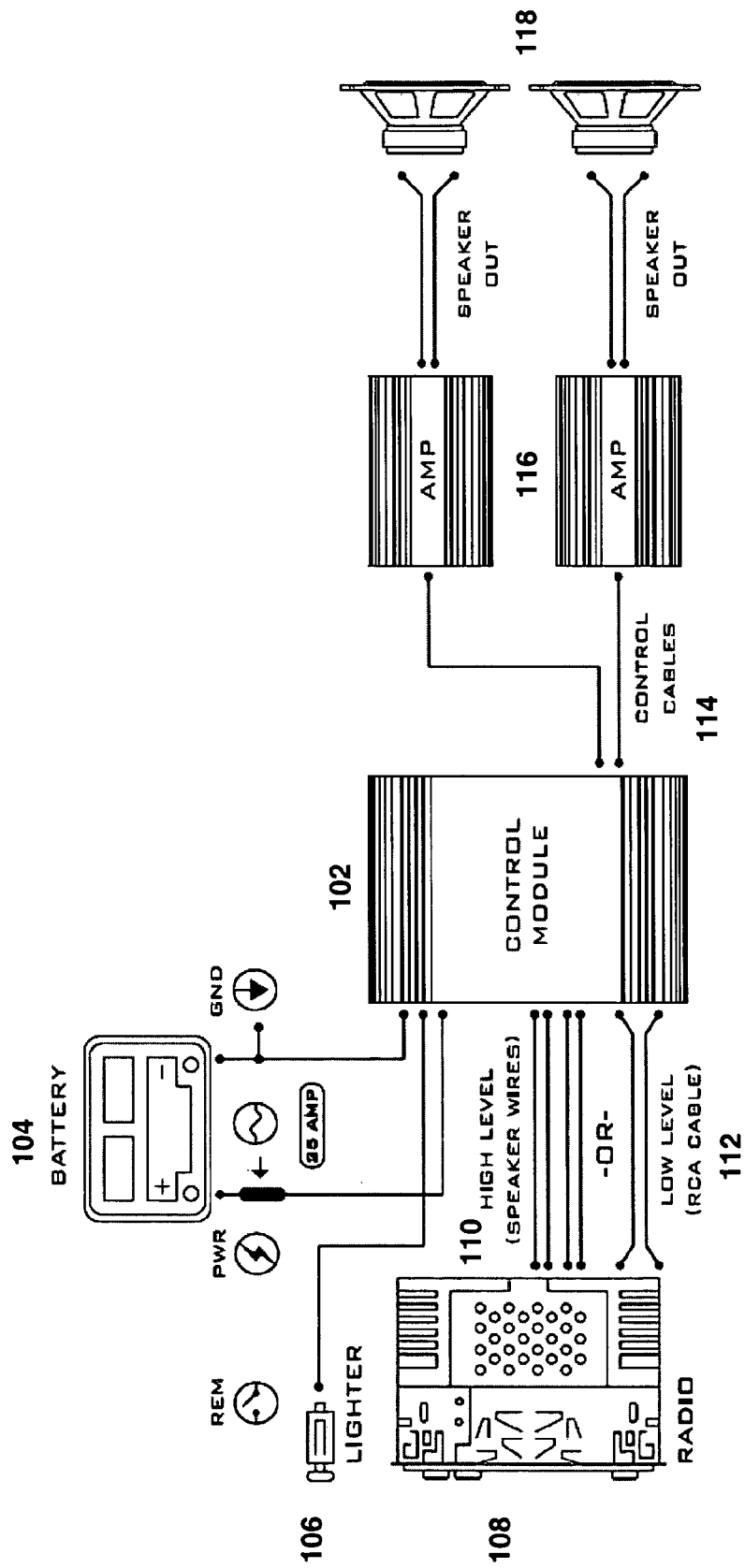

There are inherent difficulties for operators of vehicles such as motorcycles and personal watercraft who wish to listen to music or other such audio signals while riding. One difficulty is amplifying the audio signals sufficiently to allow the operator to listen to the signal at a pleasing level over external noises. This is accomplished in the prior art through the use of such components as power amplifiers and amplified speakers. Another difficulty is finding convenient locations to install all the components necessary to amplify the audio signals. Furthermore another difficulty is limited expandability of the system once the components are installed. In the prior art, power amplifiers, while small, typically offer no more than two channels. Therefore, no more than two speakers can be connected at any time. Due to heat concerns, the amount of amplification is also limited. A more powerful amplifier requires more space to accommodate a larger heat sink to dissipate the heat generated amplifying the audio signal.

Accordingly, there is a need for an amplification system that is small enough to allow an operator to install it on any convenient location on the vehicle. Furthermore, it is desirable that the amplifier system provides a powerful signal so that an operator can hear the audio signal at a comfortable level over external noises. Additionally, it is desirable that the amplifier system offers more than two channels, and is modular in that an operator can easily add on additional speakers if desired. As will be seen, the invention handles this in an elegant manner.

DETAILED DESCRIPTION

The present invention pertains to an amplification system for providing amplified audio signals to audio speakers. More specifically a modular and expandable amplification system is provided for use on a motorcycle or other personal motorized vehicle. The components of the invention include an amplifier control module, a plurality of satellite amplifiers, and a plurality of control cables to connect each satellite amplifier to the amplifier control module. In one embodiment of the invention the satellite amplifier is made significantly smaller and lighter than similar components in the prior art by eliminating the pre-amplification circuitry and power supply circuitry, and reducing the size of the required heat shrink. The pre-amplification of the audio signal, as well as the power for the amplifier is provided through circuitry in the amplifier control module. Since common circuitry is used to provide pre-amplification and power to each of the satellite amplifiers, the overall size and weight of the system is reduced over similar systems available through the prior art. The reduced size and weight of the satellite amplifiers and the overall system is a desirable feature for installing the system in locations on the vehicle that are convenient. In one embodiment, the use of common circuitry in the amplifier control module enables the system to be configured to provide audio signals to a plurality of satellite amplifiers, so that the operator can easily expand the system with minimal installation. In another embodiment, the amplifier control module may also be configured to include internal power amplifiers that the operator can connect audio speakers directly to, also providing for expandability and convenience of installation.

FIG. 1 is a diagrammatical illustration of one embodiment of the invention. The control module [102], is connected to the vehicle battery [104] to receive power and ground signals for the system. Additionally, the control module [102] is connected to an auxiliary power source on the vehicle such as a lighter jack [106]. Furthermore, the control module [102], is connected to an audio source such as a radio [108], which may be by either high level speaker wires [110], or low level RCA cables [112]. The control module [102], outputs the pre-amplified audio signal through a plurality of control cables [114], to a plurality of satellite amplifiers [116], which may be single channel amplifiers. The satellite amplifiers may then amplify the audio signal, and output the amplified signal to audio speakers [118].

Figure 2:
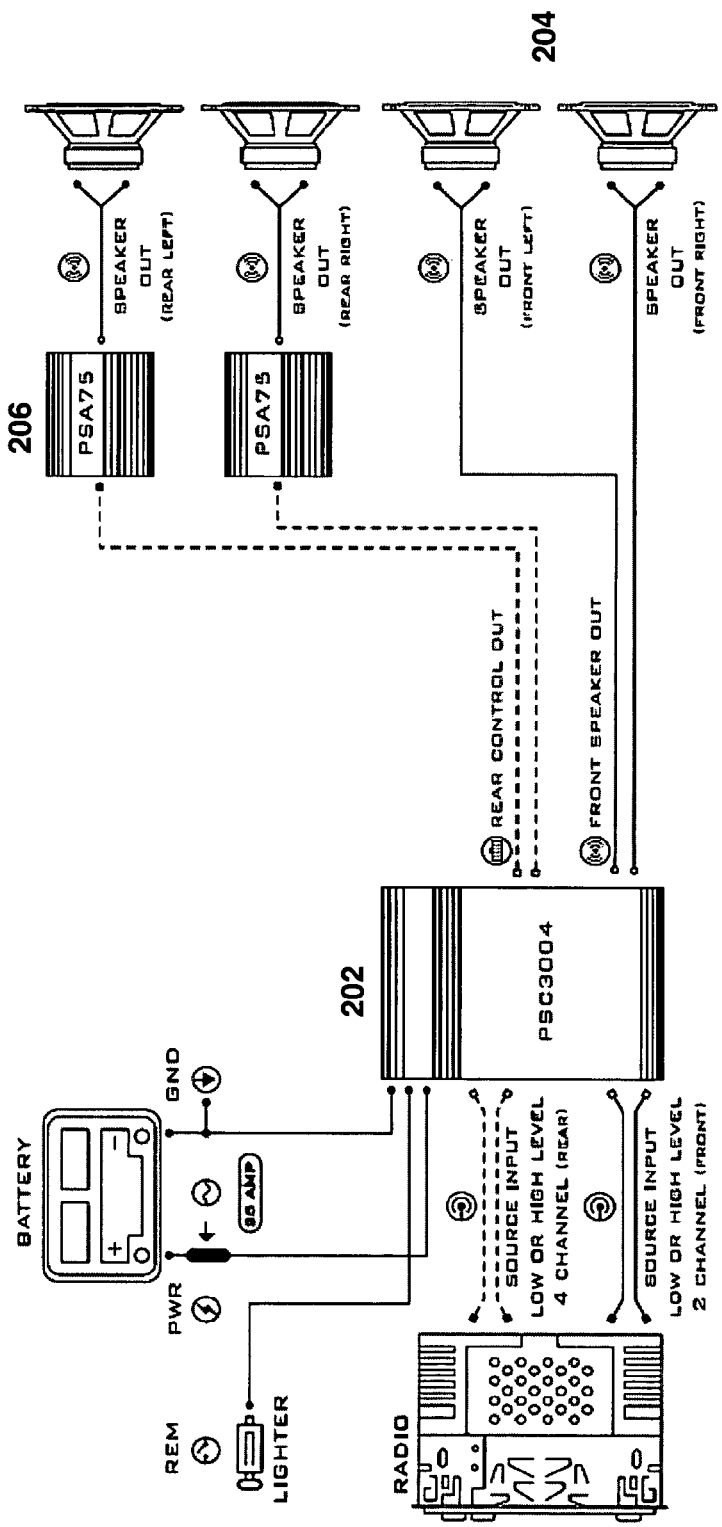

FIG. 2 is a diagrammatical representation of another embodiment of the invention. In this embodiment, a plurality of audio speakers [204] may also be connected directly to the control module [202], in addition to the plurality of speakers connected to the control module [202], through a plurality of satellite amplifiers [206].

Figure 3:
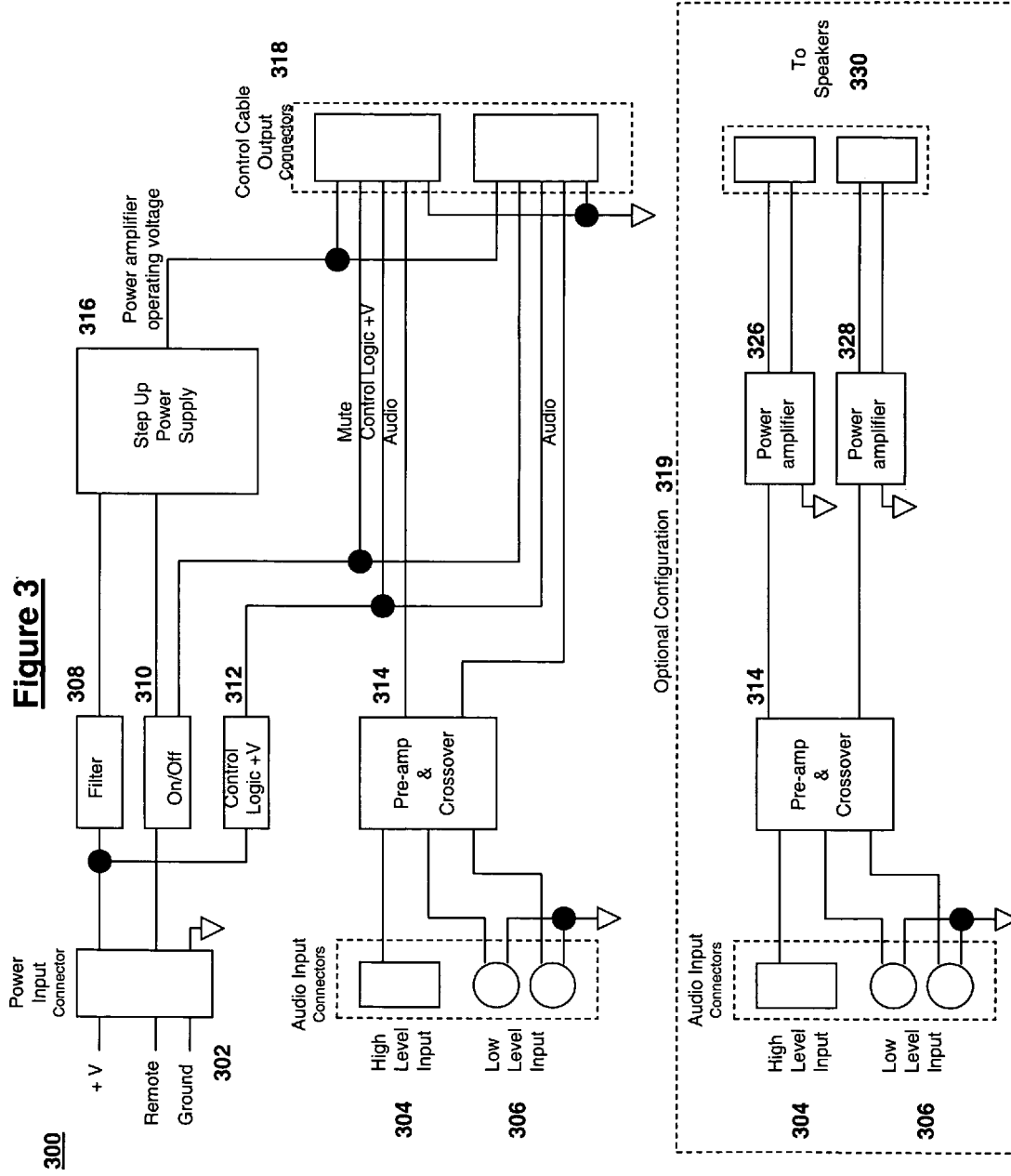

FIG. 3 is a block diagram of the control module. In one embodiment [300], the control module is configured with a power input connector [302], configured to receive a power signal from, a remote vehicle power signal, and a ground signal from the vehicle. The vehicle power signal [+V], is distributed to a power input filter circuit [308], and a control logic generating circuit [312]. The power input filter circuit [308] is configured to reduce, or eliminate electronic noise such as alternator noise from leaking into the system and affecting the output signals. The control logic generating circuit [312], is configured to trim the vehicle voltage down to an acceptable voltage for the system's logic circuits. The remote on/off circuit [310], is configured to operate as a relay to allow the power to the control module to be switched on or off without disrupting the signal from the vehicle battery. In one embodiment this circuit may be configured so that the on/off switch of the radio may also activate or deactivate the control module. The control module [300], is also configured with audio input connectors, which may be configured to accept either a high level input connector [304] such as may be used with a traditional radio speaker outputs, or a low level connector [306], such as those found on RCA cables. The audio signals from these inputs are transmitted to a pre-amplifier and crossover circuit [314], which is configured to separate the frequencies of the audio input signals, and pass the signals on to the power amplifiers. Additionally, the control module includes a step up power supply [316], which is configured to boost the vehicle voltage input to a level required to operate the power amplifier. The output voltage from the step up power supply [316], the output signal from the remote on/off circuit [310], the output voltage from the control logic generating circuit [312], and the audio signals from the pre-amp and crossover circuit [314], are distributed to the control cable output connectors [318], of which there may be a plurality. In another embodiment of the invention, [319], the control module may also include internal power amplifiers [326 and 328], which may receive the audio circuits from the pre-amplifier and crossover circuit [314], and transmit the amplified audio signal to output speaker connectors [330], where local audio speakers may be directly plugged in.

Figure 4:
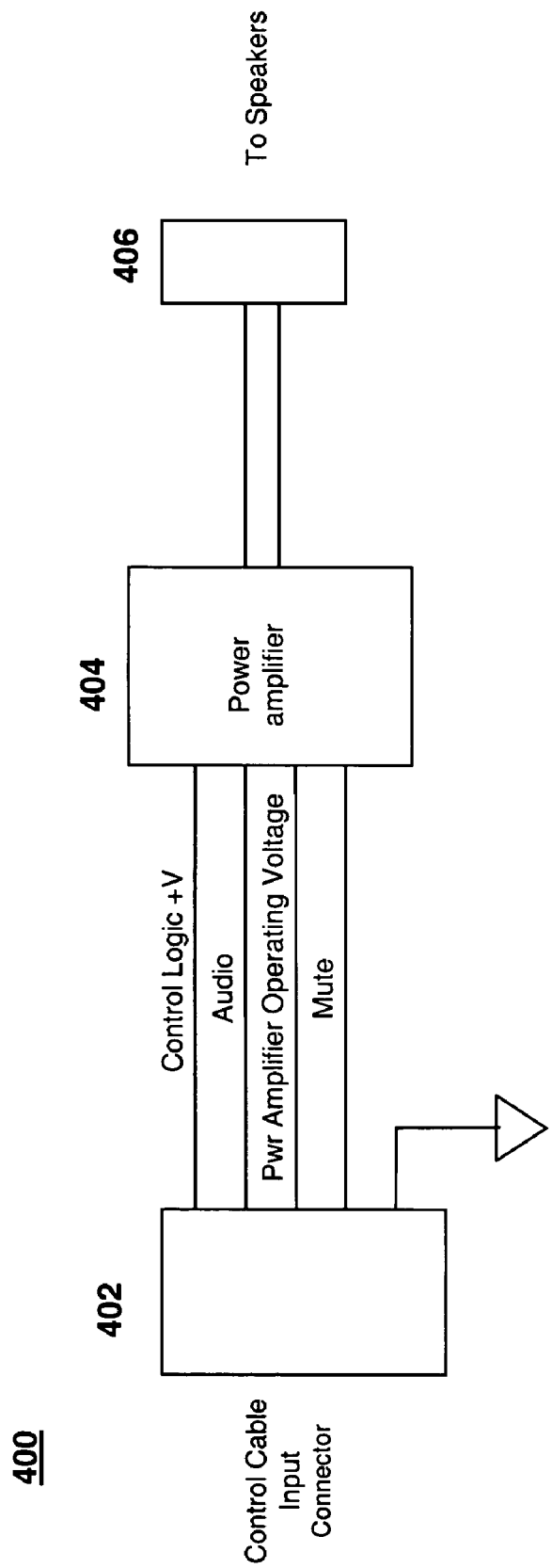

Referring to FIG. 4, a block diagram of the satellite amplifier [400] is shown. The satellite amplifier is comprised of an input connector [402] for connecting to the control cable. The control cable consists of a plurality of wires that provide audio, power, ground, and control signals from the amplifier control module to the satellite amplifiers.

Additionally, the satellite amplifier includes a power amplifier [404], for amplifying the audio signal from the amplifier control module. In one embodiment the power amplifier may be a single channel amplifier. Furthermore, the satellite amplifier includes an audio output connector [406], to transmit the amplified audio signal to a speaker.

Thus, the invention provides generally a system for amplifying audio signals from an audio source for use on a motorcycle or other personal motorized vehicle. One embodiment includes a control module configured to receive audio input signals from a source and a plurality of outputs to send amplified audio output signals to a plurality of satellite amplifiers, a plurality of satellite amplifiers configured to receive an audio signal from a source, and a plurality of control cables configured to connect the components. The system may further be modular. The control module may be comprised of a step up power supply configured to regulate the voltage required to operate the power amplifiers; a plurality of inputs configured to receive power from the vehicle and audio input signals from a plurality of audio signalling devices; a plurality of outputs configured to send output signals to a plurality of satellite amplifiers; a pre-amplifier configured to amplify the audio signals received from the audio signalling sources; a main power amplifier circuit configured to transmit the regulated power amplifier voltage sent to the satellite amplifiers; a power input filter circuit configured to eliminate electronic noise interference to the audio signal; a preamplifier crossover circuit configured to separate the incoming audio signals; a remote on/off circuit configured to allow power to the control module to be switched on or off when the power to the audio input source is turned on or off; and a power on/off pop suppression circuit configured to suppress power spikes in the system when turning the control module on or off. The satellite amplifier may include an input configured to receive audio, power, and control signals from the control module; a power amplifier configured to amplify the audio signal received from the control module; and an output configured to send an amplified audio output signal to an audio speaker.

The control cable may include a plurality of electrical cables configured to transmit audio signals from the control module to the satellite speaker; a plurality of electrical cables configured to transmit the power amplifier power voltage from the control module to the satellite amplifier; a plurality of electrical cables configured to transmit control logic voltage from the control module to the satellite amplifier; and a plurality of electrical cables configured to provide a ground path from the satellite amplifier to the vehicle ground through the control module. The pre-amplification circuits for the satellite amplifier may be located in the control module. The power circuits for the satellite amplifier may be located in the control module. The satellite amplifier may be a single channel amplifier. The satellite amplifier may be a multi-channel amplifier. The control module may include audio amplifiers configured to allow a user to directly connect localized audio speakers to the control module.

Those skilled in the art will know although the invention has been described in terms of embodiments for purposes of illustration, various modifications may be made without departing from the spirit and scope of the invention. Accordingly, the invention is not to be limited except as by the following claims.

The invention claimed is:

1. A modular system for amplifying audio signals from an audio source for use on a motorcycle comprising:
   a plurality of reduced size satellite amplifiers configured to conveniently fit into small locations about a motorcycle;
   an amplifier control module configured to receive audio input signals from a source and a plurality of outputs to send amplified audio output signals to the plurality of reduced size satellite amplifiers distributed remotely from the amplifier control module in order to reduce the size and weight of the amplifier control module;
   wherein the plurality of reduced size satellite amplifiers are configured to receive an audio signal from the amplifier control module; and
   a plurality of control cables configured to connect the components.

2. A system according to claim 1, wherein the control module is comprised of:
   a step up power supply configured to regulate the voltage required to operate the power amplifiers;
   a plurality of inputs configured to receive power from the vehicle and audio input signals from a plurality of audio signalling devices;
   a plurality of outputs configured to send output signals to a plurality of satellite amplifiers;
   a pre-amplifier configured to amplify the audio signals received from the audio signalling sources;
   a main power amplifier circuit configured to transmit the regulated power amplifier voltage sent to the satellite amplifiers;
   a power input filter circuit configured to eliminate electronic noise interference to the audio signal;
   a preamplifier crossover circuit configured to separate the incoming audio signals;
   a remote on/off circuit configured to allow power to the control module to be switched on or off when the power to the audio input source is turned on or off;
   a power on/off pop suppression circuit configured to suppress power spikes in the system when turning the control module on or off.

3. A system according to claim 1, wherein the satellite amplifier is comprised of:
   an input configured to receive audio, power, and control signals from the control module;
   a power amplifier configured to amplify the audio signal received from the control module;
   an output configured to send an amplified audio output signal to an audio speaker.

4. A system according to claim 1, wherein the control cable is comprised of:
   a plurality of electrical cables configured to transmit audio signals from the control module to the satellite speaker;
   a plurality of electrical cables configured to transmit the power amplifier power voltage from the control module to the satellite amplifier;
   a plurality of electrical cables configured to transmit control logic voltage from the control module to the satellite amplifier;
   a plurality of electrical cables configured to provide a ground path from the satellite amplifier to the vehicle ground through the control module.

5. A system according to claim 1, wherein the pre-amplification circuits for the satellite amplifier may be located in the control module.

6. A system according to claim 1, wherein the power circuits for the satellite amplifier may be located in the control module.

7. A system according to claim 1, wherein the satellite amplifier may be a single channel amplifier.

8. A system according to claim 1, wherein the satellite amplifier may be a multi-channel amplifier.

9. A system according to claim 1, wherein the control module may include audio amplifiers configured to allow a user to directly connect localized audio speakers to the control module.

10. A modular audio system for amplifying audio signals from an audio source for use in confined spaces of a motorcycle comprising:
- a plurality of reduced size satellite amplifiers configured to conveniently fit into small locations about a motorcycle;
- a reduced size amplifier control module configured to receive audio input signals from a source and a plurality of outputs to send pre-amplified audio output signals to the plurality of reduced size satellite amplifiers distributed remotely from the control module to reduce the size and weight of the control module;
- wherein the plurality of reduced size satellite amplifiers are configured to receive an audio signal from the control module and to amplify the signal at the remote location and to deliver an amplified output signal to remote speakers; and
- a plurality of control cables configured to connect the reduced size amplifier control module with the source and the remotely located reduced size satellite amplifiers.

* * * * *